United States Patent [19]

Nakashima et al.

[11] Patent Number: 4,705,912

[45] Date of Patent: Nov. 10, 1987

[54] PHOTOVOLTAIC DEVICE

[75] Inventors: Yukio Nakashima, Hirakata; Hisao Haku, Neyagawa; Kaneo Watanabe, Yawata; Tsugufumi Matsuoka, Neyagawa, all of Japan

[73] Assignee: Sanyo Electric Co., Ltd., Moriguchi, Japan

[21] Appl. No.: 909,255

[22] Filed: Sep. 19, 1986

[30] Foreign Application Priority Data

Sep. 27, 1985 [JP] Japan .................................... 215262

[51] Int. Cl.$^4$ ............................................ H01L 31/06
[52] U.S. Cl. ...................................... 136/258; 357/30; 357/59; 437/2; 437/101; 437/110; 148/DIG. 160
[58] Field of Search .................. 136/258 AM, 249 TJ; 357/30, 59 C

[56] References Cited

U.S. PATENT DOCUMENTS

| 4,064,521 | 12/1977 | Carlson | 357/2 |
| 4,385,199 | 5/1983 | Hamakawa et al. | 136/258 |
| 4,492,810 | 1/1985 | Ovshinsky et al. | 136/255 |
| 4,531,015 | 7/1985 | Wong et al. | 136/258 AM |

FOREIGN PATENT DOCUMENTS

| 0122778 | 10/1984 | European Pat. Off. | 136/258 |
| 2111303 | 6/1983 | United Kingdom | 136/258 |
| 2137810 | 10/1984 | United Kingdom | 136/258 |

OTHER PUBLICATIONS

S. Tsuda et al., *Conference Record, 18th IEEE Photovoltaic Specialists Conf.* (1985), pp. 1295–1300. (Published Apr. 1986).

R. R. Arya et al., *Conference Record, 18th IEEE Photovoltaic Specialists Conf.* (1985), pp. 1710–1711 (Published Apr. 1986).

"Solid-State Superlattices", in Scientific American, vol. 249; (1983); pp. 144–151, by Gottfried H. Doehler.

*Primary Examiner*—Aaron Weisstuch
*Attorney, Agent, or Firm*—W. G. Fasse; D. H. Kane, Jr.

[57] ABSTRACT

A photovoltaic device has a semiconductive multilayer of one conductivity type, which includes a plurality of amorphous thin constituent layers of different kinds stacked periodically to form at least one quantum well. A semiconductor layer of an i-type, which is contiguous to the multilayer so that light may be applied to the i-type layer through the multilayer.

10 Claims, 6 Drawing Figures

PHOTOVOLTAIC DEVICE

FIELD OF THE INVENTION

The present invention relates to a photovoltaic device for converting optical energy into electric energy.

DESCRIPTION OF THE PRIOR ART

A typical conventional photovoltaic cell such as described in U.S. Pat. No. 4,064,521 comprises a front transparent electrode layer, amorphous silicon (a-Si) layers composing a p-i-n junction structure, and a back electrode layer stacked in this order on a glass plate. A photovoltaic cell disclosed in U.S. Pat. No. 4,385,199 is improved in the conversion efficiency by providing a p-layer of amorphous silicon carbide (a-Si$_{1-x}$C$_x$) instead of the p-layer of a-Si. Since the p-layer of a-Si$_{1-x}$C$_x$ is optically less absorptive than the p-layer of a-Si, light irradiation to the i-layer of a-Si which substantially contributes to the photoelectric conversion becomes more effective due to the so-called window effect and thus the output current is increased.

Such photovoltaic cells according to the prior art, however, do not yet have a satisfactory collection efficiency in the spectral range of less than 500 nm.

SUMMARY OF THE INVENTION

In view of the prior art, it is an object of the present invention to provide a photovoltaic device having an improved collection efficiency particularly in the shorter wavelength range of the spectrum.

It is another object of the present invention to provide a photovoltaic device having parameters of its electric characteristics which can be easily controlled.

A photovoltaic device in accordance with the present invention comprises: a semiconductive multilayer of one conductivity type, which includes a plurality of amorphous thin constituent layers of different kinds stacked periodically; and a semiconductor layer of a substantially intrinsic type (hereinafter referred to simply as an i-type), which is contiguous to the multilayer and to which light is applied through the multilayer.

These objects and other objects, features, aspects and advantages of the present invention will become more apparent from the following detailed description of the present invention when taken in conjunction with the accompanying drawings.

DESCRIPTION OF PREFERRED EXAMPLE EMBODIMENTS AND OF THE BEST MODE OF THE INVENTION

Figure 1:
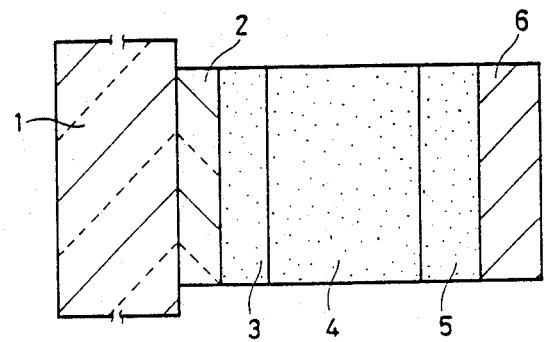
FIG. 1 is a schematic sectional view of a photovoltaic cell in accordance with the present invention.

Referring to FIG. 1, there is shown a schematic sectional view of a p-i-n type photovoltaic cell according to an embodiment of the present invention. A first electrode 2 is formed on a transparent insulative substrate 1 such as a glass plate. The first electrode 2 is made of a transparent conductive oxide (TCO) such as In$_2$O$_3$, SnO$_2$, or a mixture thereof (ITO). A semiconductive multilayer 3 of a p-type, an a-Si layer 4 of an i-type, and a doped semiconductor layer 5 of an n-type are stacked in this order on the first electrode 2. A second electrode 6 is formed on the doped n-layer 5. The electrode 6 comprises a metal layer or stacked layers of TCO/metal and makes an ohmic contact with the n-layer 5. If the second electrode 6 is formed of a material (e.g., magnesium) which can make an ohmic contact with the i-layer 4, the doped n-layer 5 may be omitted.

The i-layer 4 is exposed to light through the transparent substrate 1, the transparent electrode 2, and the p-multilayer 3. The i-layer 4, excited by photons, generates pairs of free electrons and positive holes as electric charge carriers. The generated electrons and holes move in an electric field due to the p-i-n junction toward the second electrode 6 and the first electrode 2, respectively, whereby an output current can be obtained between the first and second electrodes.

A significant feature of this embodiment resides in the p-multilayer 3 which comprises a plurality of amorphous thin constituent layers of different kinds stacked periodically one on the other in sequence.

Figure 2A:
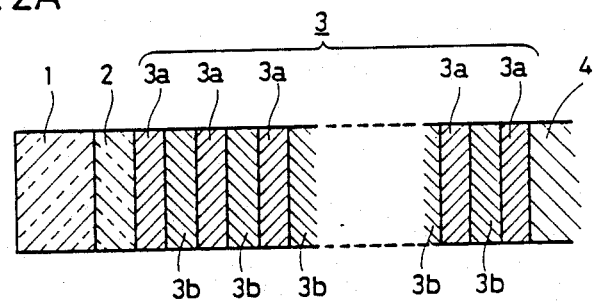
FIG. 2A is a sectional view for illustrating a structure of a p-type multilayer in the cell of FIG. 1.

Referring to FIG. 2A, there is illustrated a sectional structure of such a multilayer 3. Amorphous thin constituent layers of different kinds 3a and 3b are alternately stacked up to a total thickness of less than about 1000 Å, preferably less than a few 100 Å, to form a multilayer 3 on a transparent electrode 2. The constituent layers 3a and 3b have their respective energy band gaps and/or conductivity types different from each other, and each of the constituent layers is deposited to a thickness less than about 50 Å, preferably less than a few 10 Å. In this embodiment, the constituent layers of one kind 3a (or 3b) are formed of a p-type and the remaining layers of the other kind 3b (or 3a) are formed of an i-type so that the resultant multilayer 3 may have a p-type conductivity. Further, the constituent layers of one kind 3a (or 3b) have an energy band gap larger than those in the constituent layers of the other kind 3b (or 3a) and the i-layer 4.

A material having a relatively larger energy band gap E$_{opt}$ may be suitably selected from amorphous silicon carbide (a-Si$_{1-x}$C$_x$: x=0–0.8, E$_{opt}$=1.7–2.8 eV), amorphous silicon nitride (a-Si$_{1-x}$N$_x$: x=0–0.4, E$_{opt}$=1.7–3.5 eV), amorphous silicon oxide (a-Si$_{1-x}$O$_x$: x=0–0.5, E$_{opt}$=1.7–3.0 eV), amorphous carbon (a-C), etc.

On the other hand, a material having a relatively smaller band gap E$_{opt}$ may be selected from amorphous silicon (a-Si), amorphous silicon germanium (a-Si$_{1-x}$Ge$_x$: x=0–1, E$_{opt}$=0.7–1.7 eV), amorphous silicon tin (a-Si$_{1-x}$Sn$_x$: x=0–1, E$_{opt}$=0.7–1.7 eV), etc.

As is known, the band gap changes depending upon conditions of fabrication, and in an alloyed semiconductor the band gap changes depending upon the composition. Therefore, it is possible to realize different band gaps in materials of the same system. Further, the widths of the band gaps are compared relatively between two or more kinds of the constituent layers in the multilayer. Thus, the combination of materials for different kinds of the constituent layers is not limited to the above described examples.

Figure 2B:
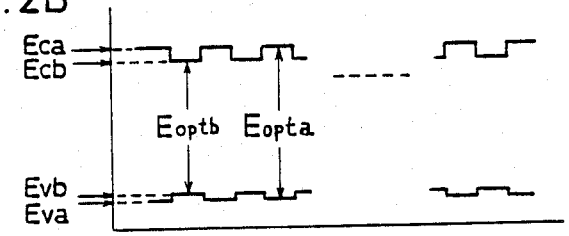
FIG. 2B is an energy band profile in the multilayer of FIG. 2A.

FIG. 2B shows an energy band gap profile corresponding to the sectional structure of a multilayer of FIG. 2A, in which hydrogenated a-SiC (a-SiC:H) of an i-type (or a p-type) having a relatively larger band gap is adopted for the constituent layers of one kind 3a and hydrogenated a-Si (a-Si:H) of a p-type (or an i-type) having a relatively smaller band gap is adopted for the remaining layers of the other kind 3b. The constituent layer 3a and 3b have the respective lowest energy levels $E_{ca}$ and $E_{cb}$ of their conduction bands and the respective highest energy levels $E_{va}$ and $E_{vb}$ of their valence bands. Accordingly, in the resultant multilayer 3, a relatively larger band gap $E_{opta}=E_{ca}-E_{va}$ and a relatively smaller band gap $E_{optb}=E_{cb}-E_{vb}$ form a periodic band gap profile, namely, a multiplicity of quantum wells.

Figure 3:
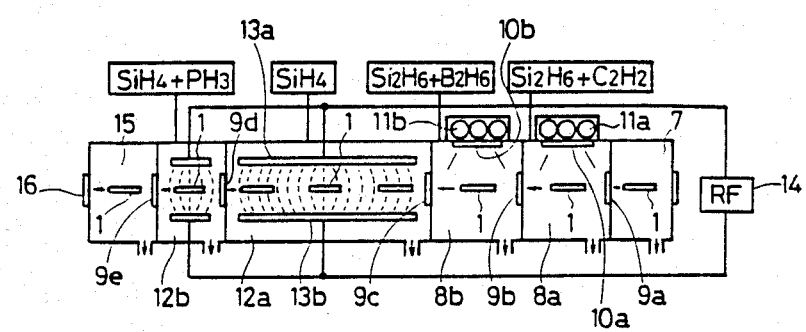
FIG. 3 is a conceptional view of a CVD apparatus used in fabricating a photovoltaic cell in accordance with the present invention.

FIG. 3 illustrates schematically a CVD apparatus which is used in fabricating a photovoltaic cell in accordance with the present invention. In this figure, a first photo-CVD chamber 8a neighbors, through an openable separation shutter 9a, a preparatory chamber 7 into which a substrate 1 is introduced from the exterior. Similarly, a second photo-CVD chamber 8b adjoins the first photo-CVD chamber 8a through a separation shutter 9b. Ceilings of the first and second photo-CVD chambers 8a, 8b include windows 11a, 11b above which light sources 11a, 11b are provided, respectively. Each of the light sources 11a, 11b comprises low pressure mercury lamps which radiate ultraviolet light with wavelengths of 1849 Å and 2537 Å. The ultraviolet light radiated from by the light sources 11a, 11b is introduced into the photo-CVD chambers 8a, 8b through the respective windows 10a, 10b.

In the first photo-CVD chamber 8a, a constituent layer 3a of a-Si$_{1-x}$C$_x$:H is deposited depending on the proportion of C$_2$H$_2$ to Si$_2$H$_6$ in a reaction gas. In the second photo-CVD chamber 8b, on the other hand, a constituent layer 3b of p-type a-Si:H is deposited from a reaction gas containing Si$_2$H$_6$ and B$_2$H$_6$. The first and second photo-CVD chambers 8a, 8b are utilized alternately and repeatedly to obtain a p-type multilayer 3 which comprises the constituent layers 3a, 3b stacked periodically or alternately in sequence.

Such a multilayer 3 can be also obtained by using a single photo-CVD chamber. However, fabrication of such a multilayer 3 in a single photo-CVD chamber requires a certain and perfect exchange of different reaction gases. Namely, after every formation of a constituent layer of one kind, evacuation must be carried out for a long time period enough to completely remove a reaction gas from the single photo-CVD chamber.

Photo-CVD is more preferable than plasma CVD in fabricating such a multilayer 3, since the multilayers 3 tend to be damaged by plasma at the interface between different kinds of constituent layers 3a, 3b so that it is likely that mixing or interdiffusion of impurities occurs between the constituent layers resulting an indefinite periodicity or alternately sequence.

After the periodic constituent layers 3a, 3b totaled, e.g., ten layers to complete a multilayer 3, the substrate 1 is moved through an opened separation shutter 9c into a first plasma CVD chamber 12a neighboring on the second photo-CVD chamber 8b. The first plasma CVD chamber 12a is provided with counter electrodes 13a, 13b for causing a glow discharge and then plasma CVD from a gas containing SiH$_4$, Si$_2$H$_6$, SiF$_4$ or the like. The electrodes 13a, 13b are connected to an external power source 14 and supplied with a radio frequency power of 13.56 MHz, for example. In this first plasma CVD chamber 12a, an i-type semiconductor layer 4 is deposited.

After deposition of the i-type semiconductor layer 4, the substrate is moved into a second plasma CVD chamber 12b through an opened separation shutter 9d. Similarly as in the first plasma CVD chamber, an n-type semiconductor layer 5 is deposited on the i-type semiconductor layer 4 in the second plasma CVD chamber 12b, utilizing SiH$_4$, Si$_2$H$_6$, SiF$_4$, PH$_3$, etc.

After deposition of the n-type semiconductor layer 5, the substrate 1 is moved into an extra chamber 15 through an opened separation shutter 9e and then the substrate 1 with the layers thereon is taken out through an opened outlet shutter 16.

A preferable p-type multilayer 3 in a photovoltaic device according to this embodiment comprises i-type a-SiC:H constituent layers 3a each having a thickness of about 10 Å and p-type a-Si:H constituent layers 3b each having a thickness of about 25 Å. These two kinds of constituent layers are stacked alternately up to a total of ten layers. This p-type multilayer 3 has a synthetic band gap $E_{opt}=2.1$ eV, a dark conductivity $\delta_d=10^{-7}\Omega^{-1}\text{cm}^{-1}$, and a photoconductivity $\delta_{ph}=10^{-6}\Omega^{-1}\text{cm}^{-1}$. An a-Si:H layer of about 5000 Å thickness is formed as an i-type semiconductor layer 4 while an n-type a-Si:H layer of about 400 Å thickness is formed as an n-type doped semiconductor layer 5.

Table I shows typical CVD conditions in the CVD apparatus of FIG. 3.

TABLE I

| | Typical CVD Conditions | | | |
|---|---|---|---|---|
| Layer | P-multilayer | | I-layer | N-layer |
| Composition | p-type a-Si:H | i-type a-SiC:H | i-type a-Si:H | n-type a-Si:H |
| CVD | Photo-CVD | Photo-CVD | Plasma CVD | Plasma CVD |
| Energy Source | Low Pressure Mercury Lamp | Low Pressure Mercury Lamp | 13.56 MHzRF | 13.56 MHzRF |
| Source Gas (Doping Amount) | Si$_2$H$_6$ | Si$_2$H$_6$, C$_2$H$_2$ | SiH$_4$ | SiH$_4$ |
| | B$_2$H$_6$ (0.3~1%) | $\dfrac{C_2H_2}{Si_2H_6 + C_2H_2} = 50\%$ | | PH$_3$ (1%) |
| Pressure | 80 Pa | 100 Pa | 30 Pa | 30 Pa |
| Substrate Temperature | 200° C. | 200° C. | 200° C. | 200° C. |

TABLE I-continued

| Layer | Typical CVD Conditions | | |
| --- | --- | --- | --- |
| | P-multilayer | I-layer | N-layer |
| Reaction Time 30 sec | 30 sec | 40 min | 5 min |

Figure 4:
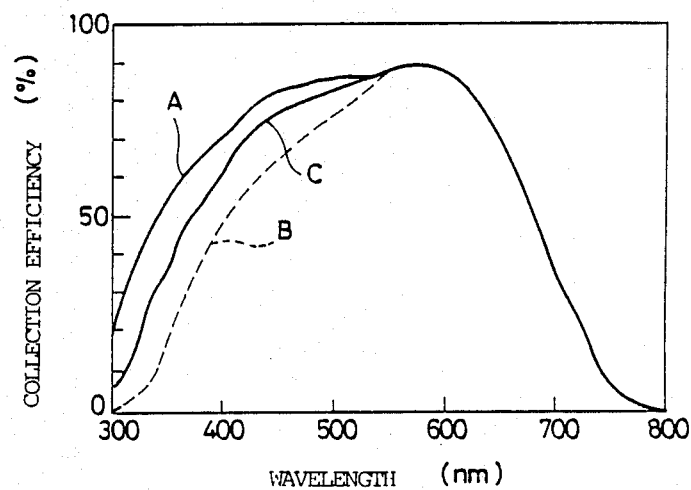
FIG. 4 is a graph showing the spectral dependency of the collection efficiency in various photovoltaic cells.

FIG. 4 shows the collection efficiency in various photovoltaic devices over the spectral range of 300-800 nm. Curve A represents a photovoltaic device according to the above described embodiment and shows the relatively higher collection efficiency particularly in the spectral range of less than about 500 nm. This higher collection efficiency is believed to be caused by the large synthetic band gap $E_{opt}=2.1$ eV and the good photoconductivity $\delta_{ph}=10^{-6}\Omega^{-1}cm^{-1}$ in the p-multilayer 3. Namely, the p-multilayer 3 having the large band gap admits incident light to the i-layer 4 with a small absorption loss, while generated carriers in the i-layer 4 are efficiently led out as a current through the p-multilayer 3 having the good photoconductivity.

For comparison, curve B shows the collection efficiency of a prior art photovoltaic device which has a single p-type a-SiC:H layer of about 150 Å thickness instead of the p-multilayer 3.

Curve C represents a photovoltaic device according to another embodiment in which i-type a-SiN:H constituent layers each having a thickness of about ≈Å and p-type a-Si:H constituent layers each having a thickness of about 25 Å are stacked alternately up to a total of ten layers to form a p-multilayer 3.

As clearly seen in FIG. 4, photovoltaic devices in accordance with the present invention are improved in spectral response, i.e., collection efficiency in the spectral range of less than 500 nm, and thus the photovoltaic current is increased.

Figure 5:
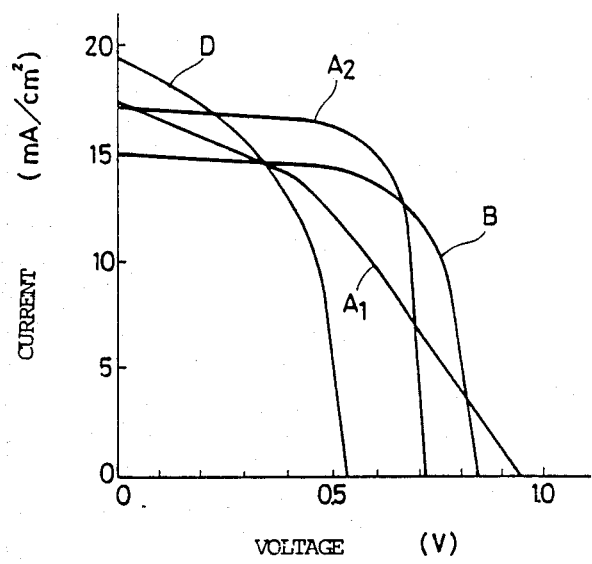
FIG. 5 is a graph showing the V-I characteristic in various photovoltaic cells.

FIG. 5 shows the V-I characteristic of various photovoltaic devices. As will be noted in the following description, parameters (open circuit voltage $V_{oc}$, short circuit current $I_{sc}$, fill factor FF) of the electric characteristics in a photovoltaic device in accordance with the present invention can be controlled by selecting a conductivity type and/or a composition of the end constituent layer which brings the multilayer 3 into contact with the i-type semiconductor layer 4.

In FIG. 5, although curves $A_1$ and $A_2$ represent photovoltaic devices in which p-type a-Si:H constituent layers each having a thickness of about 25 Å and i-type a-SiC:H constituent layers each having a thickness of about 10 Å are alternately stacked to a total of ten layers to form a p-multilayer 3, the device represented by the curve $A_1$ has an end constituent layer of i-type a-SiC:H in contact with an i-type semiconductor layer 4 and shows a high $V_{oc}$ value, while the device represented by the curve $A_2$ has alternatively an end constituent layer of p-type a-Si:H and shows a high FF value.

Curve D shows the V-I characteristic of a device which has a multilayer 3 comprising i-type a-Si:H constituent layers each having a thickness of about 25 Å and p-type a-SiC:H constituent layers each having a thickness of about 10 Å, in which an i-type semiconductor layer 4 is in contact with an end constituent layer of p-type a-SiC:H. This device D shows a high $I_{sc}$ value.

For comparison, curve B shows the V-I characteristic of a prior art device which has a single p-type SiC:H layer of about 150 Å thickness instead of the p-multilayer 3.

Table II shows parameters of the electric characteristics in various photovoltaic devices in conjunction with FIG. 5.

TABLE II

| | | V-I Characteristic | | |
| --- | --- | --- | --- | --- |
| Curve | End Constituent Layer | $V_{oc}(V)$ | $I_{sc}(mA/cm^2)$ | FF |
| $A_1$ | i-type a-SiC:H | 0.92 | 17.4 | 0.45 |
| $A_2$ | p-type a-Si:H | 0.75 | 17.9 | 0.67 |
| D | p-type a-SiC:H | 0.53 | 19.0 | 0.53 |
| B | p-type s-SiC:H (single layer) | 0.85 | 15.6 | 0.72 |

As noted from FIG. 5 and Table II, parameters of the electric characteristics in a photovoltaic device in accordance with the present invention can be readily controlled by selecting a band gap and/or a conductivity type of the end constituent layer which brings the p-multilayer 3 into contact with the i-type semiconductor layer 4.

Although p-i-n type devices have been described in the above embodiments, it will be understood that an n-type multilayer may be formed in an inverted n-i-p type device.

Further, although photovoltaic devices to which light is applied through the transparent substrate have been described in the above embodiment, it will be understood that if light is applied inversely, the second electrode 6 will be formed of a TCO layer and the first electrode 2 will be formed of a metallic layer of Al, Ti, Ag, a Ti-Ag alloy, or the like.

Further, although $Si_2H_6$, $C_2H_2$, and $B_2H_6$ have been mentioned in the above described photo-CVD, it will be understood that $SiH_4$, $SiF_4$, $SiH_2(CH_3)_2$, $PH_3$, $NH_3$, $O_2$, etc. may be also utilized suitably for the kinds of constituent layers to be deposited.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising a transparent first electrode (2), a semiconductive multilayer (3) of one conductivity type on said first transparent electrode (2), said semiconductive multilayer (3) comprising a plurality of amorphous thin constituent layers of different types stacked periodically for forming a periodical band gap profile having a multiplicity of quantum wells for improving the light collection efficiency; a semiconductor layer (4) of an i-type located contiguous to said multilayer (3), said transparent first electrode passing light to said i-type semiconductor layer (4) through said semiconductive multilayer (3), and a second electrode (6) arranged for providing an electrical output when light enters into said photovoltaic device through said first transparent electrode.

2. The photovoltaic device of claim 1, wherein at least one type of said constituent layers is deposited by photo-CVD.

3. The photovoltaic device of claim 1, wherein one type of said constituent layers is of silicon carbide.

4. The photovoltaic device of claim 3, wherein said constituent layers of silicon carbide are of an i-type, and said multilayer is contiguous to said i-type semiconductor layer through one of said constituent layers of i-type silicon carbide.

5. The photovoltaic device of claim 1, wherein one type of said constituent layers is of hydrogenated silicon carbide.

6. The photovoltaic device of claim 1, wherein one type of said constituent layers is of p-type silicon carbide.

7. The photovoltaic device of claim 6, wherein said multilayer is contiguous to said i-type semiconductor layer through one of said constituent layers of p-type silicon carbide.

8. The photovoltaic device of claim 1, wherein one type of said constituent layers is of p-type silicon.

9. The photovoltaic device of claim 8, wherein said multilayer is contiguous to said i-type semiconductor layer through one of said constituent layers of p-type silicon.

10. The photovoltaic device of claim 1, wherein said multilayer includes one type of constituent layers of i-type silicon carbide and another type of constituent layers of p-type silicon.

* * * * *